United States Patent
Zhang et al.

(10) Patent No.: US 10,658,246 B2
(45) Date of Patent: May 19, 2020

(54) SELF-ALIGNED VERTICAL FIN FIELD EFFECT TRANSISTOR WITH REPLACEMENT GATE STRUCTURE

(71) Applicant: INTERNATIONAL BUSINESS MACHINES CORPORATION, Armonk, NY (US)

(72) Inventors: Chen Zhang, Albany, NY (US); Tenko Yamashita, Schenectady, NY (US); Kangguo Cheng, Schenectady, NY (US); Xin Miao, Guilderland, NY (US); Juntao Li, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/113,625

(22) Filed: Aug. 27, 2018

(65) Prior Publication Data
US 2020/0066599 A1   Feb. 27, 2020

(51) Int. Cl.
| | |
|---|---|
| *H01L 29/66* | (2006.01) |
| *H01L 21/8234* | (2006.01) |
| *H01L 29/78* | (2006.01) |
| *H01L 27/088* | (2006.01) |
| *H01L 29/165* | (2006.01) |
| *H01L 21/02* | (2006.01) |

(Continued)

(52) U.S. Cl.
CPC ........... *H01L 21/823487* (2013.01); *H01L 21/02532* (2013.01); *H01L 21/823437* (2013.01); *H01L 27/088* (2013.01); *H01L 29/1037* (2013.01); *H01L 29/165* (2013.01); *H01L 29/6656* (2013.01); *H01L 29/66545* (2013.01); *H01L 29/66553* (2013.01); *H01L 29/7827* (2013.01); *H01L 21/0228* (2013.01); *H01L 21/02164* (2013.01); *H01L 21/02274* (2013.01); *H01L 21/02543* (2013.01); *H01L 21/02546* (2013.01); *H01L 21/31053* (2013.01); *H01L 21/31116* (2013.01); *H01L 21/8252* (2013.01); *H01L 29/205* (2013.01)

(58) Field of Classification Search
CPC .................................. H01L 21/823487
USPC ........................................ 257/192
See application file for complete search history.

(56) References Cited

U.S. PATENT DOCUMENTS

| | | |
|---|---|---|
| 6,770,534 B2 | 8/2004 | Cho et al. |
| 7,683,428 B2 | 3/2010 | Chidambarrao et al. |

(Continued)

*Primary Examiner* — Ajay Arora
(74) *Attorney, Agent, or Firm* — Tutunjian & Bitetto, P.C.; Vazken Alexanian

(57) ABSTRACT

A method of forming a vertical field effect transistor device is provided. The method includes forming one or more fin stacks on a substrate, wherein the fin stacks include a lower junction plate, a vertical fin on the top surface of the lower junction plate, and an upper junction plate on the top surface of the vertical fin. The method further includes removing a portion of the lower junction plate and upper junction plate to form recessed spaces, and forming an inner spacer in the recessed spaces. The method further includes forming a sacrificial layer on the exposed surfaces of the vertical fin and the substrate. The method further includes forming a protective liner on the sacrificial layer and inner spacers, and removing the portion of the sacrificial layer on the surface of the substrate to leave a hanging portion of the protective liner extending below the inner spacer.

15 Claims, 10 Drawing Sheets

(51) Int. Cl.
  *H01L 29/10*   (2006.01)
  *H01L 21/3105*   (2006.01)
  *H01L 29/205*   (2006.01)
  *H01L 21/8252*   (2006.01)
  *H01L 21/311*   (2006.01)

(56) References Cited

U.S. PATENT DOCUMENTS

| | | |
|---|---|---|
| 9,525,064 B1 | 12/2016 | Balakrishnan et al. |
| 9,780,197 B1 | 10/2017 | Xie et al. |
| 9,859,388 B1 | 1/2018 | Cheng et al. |
| 9,882,047 B2 | 1/2018 | Leobandung |
| 9,899,529 B2 | 2/2018 | Hong et al. |
| 2006/0166429 A1 | 7/2006 | Chaudhry et al. |
| 2006/0261406 A1 | 11/2006 | Chen |
| 2017/0236757 A1* | 8/2017 | Nyhus ............... H01L 29/66666 257/329 |
| 2018/0006118 A1 | 1/2018 | Mallela et al. |
| 2018/0090598 A1 | 3/2018 | Xie et al. |
| 2019/0319094 A1* | 10/2019 | Cheng ................ H01L 29/0847 |

* cited by examiner

SELF-ALIGNED VERTICAL FIN FIELD EFFECT TRANSISTOR WITH REPLACEMENT GATE STRUCTURE

BACKGROUND

Technical Field

The present invention generally relates to a fin field effect transistor device, and more particularly to a vertical transport fin field effect transistor (VT FinFET) device.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed. Two FETs also can be coupled to form a complementary metal oxide semiconductor (CMOS) device, where a p-channel MOSFET and n-channel MOSFET are electrically coupled together.

SUMMARY

In accordance with an embodiment of the present invention, a method of forming a vertical field effect transistor device is provided. The method includes forming one or more fin stacks on a substrate, wherein the fin stacks include a lower junction plate, a vertical fin on the top surface of the lower junction plate, and an upper junction plate on the top surface of the vertical fin. The method further includes removing a portion of the lower junction plate and upper junction plate to form recessed spaces, and forming an inner spacer in the recessed spaces. The method further includes forming a sacrificial layer on the exposed surfaces of the vertical fin and the substrate. The method further includes forming a protective liner on the sacrificial layer and inner spacers, and removing the portion of the sacrificial layer on the surface of the substrate to leave a hanging portion of the protective liner extending below the inner spacer.

In accordance with another embodiment of the present invention, a method of forming a vertical field effect transistor device is provided. The method includes forming one or more fin stacks on a substrate, wherein the fin stacks include a lower junction plate, a vertical fin on the top surface of the lower junction plate, and an upper junction plate on the top surface of the vertical fin. The method further includes removing a portion of the lower junction plate and upper junction plate to form recessed spaces. The method further includes forming an inner spacer in the recessed spaces. The method further includes forming a sacrificial layer on the exposed surfaces of the vertical fin and the substrate. The method further includes forming a protective liner on the sacrificial layer and inner spacers. The method further includes removing the portion of the sacrificial layer on the surface of the substrate to leave a hanging portion of the protective liner extending below the inner spacer, and removing the protective liner.

In accordance with yet another embodiment of the present invention, a vertical field effect transistor device is provided. The vertical field effect transistor device includes a fin stack on a supporting pillar, wherein the fin stacks include a lower junction plate on the supporting pillar, a vertical fin on the top surface of the lower junction plate, and an upper junction plate on the top surface of the vertical fin. The device further includes a lower inner spacer on the sidewalls of the lower junction plate, and an upper inner spacer on the sidewalls of the upper junction plate. The device further includes a doped layer on the substrate and supporting pillar, wherein the doped layer is below the lower junction plate and lower inner spacer. The device further includes a bottom spacer layer on the doped layer, and a gate dielectric layer on the bottom spacer layer and the vertical fin.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a method of forming vertical fin field effect transistor devices with gate structures self-aligned with the upper and lower junctions.

Embodiments of the present invention provide vertical fin field effect transistor devices with gate structures self-aligned with the upper and lower junctions.

Embodiments of the present invention provide a method of forming VFET device structures wherein the device channel is positioned between a lower and an upper junction layer which provide the means to define the junctions of the VFET relative to the device channel. Epitaxial growth of a SiGe/Si/SiGe trilayer can be patterned into a vertical fin, that can be processed to form sacrificial $SiO_2$ layers. Doped source/drain layers can be formed below the lower junction layer and an upper doped source/drain plug can be formed above the upper junction layer, where the lower and an upper junction layers can define the junctions of the VFET.

Exemplary applications/uses to which the present invention can be applied include, but are not limited to: inverters, digital logic gates, for example, NAND gates, NOR gates, Flip-Flops, and multiplexors.

It is to be understood that aspects of the present invention will be described in terms of a given illustrative architecture; however, other architectures, structures, substrate materials and process features and steps can be varied within the scope of aspects of the present invention.

Figure 1:
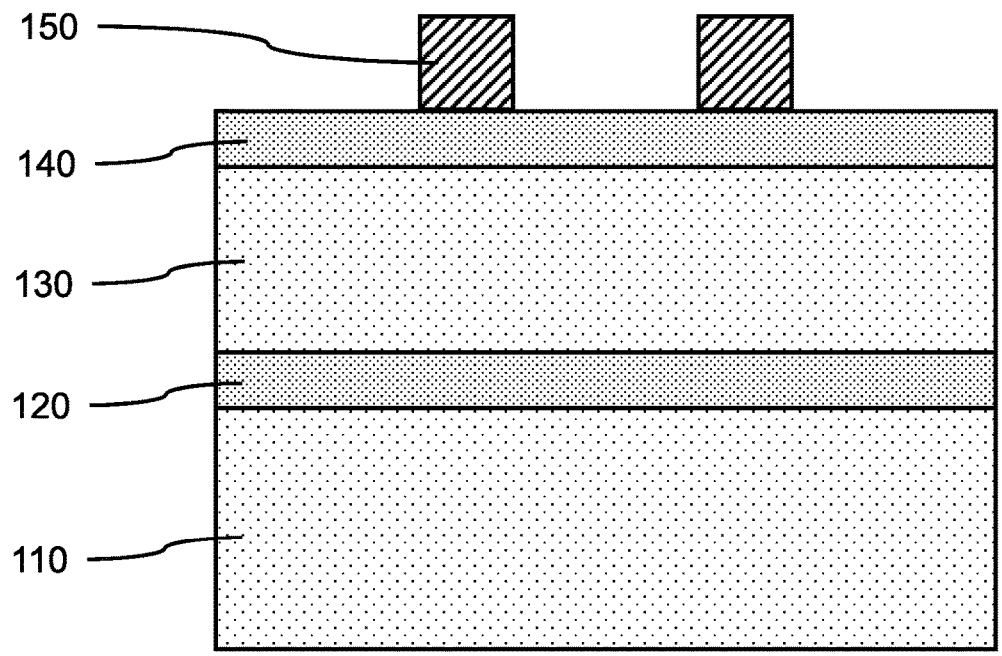
FIG. 1 is a cross-sectional side view showing a lower junction layer, a vertical fin layer, an upper junction layer, and a plurality of fin templates on a substrate, in accordance with an embodiment of the present invention.

Referring now to the drawings in which like numerals represent the same or similar elements and initially to FIG. 1, a cross-sectional side view of a lower junction layer, a vertical fin layer, an upper junction layer, and a plurality of fin templates on a substrate is shown, in accordance with an embodiment of the present invention In one or more embodiments, a lower junction layer 120 can be formed on the surface of a substrate 110, where the lower junction layer can be formed by epitaxial or heteroepitaxial growth on a crystalline surface of the substrate 110.

In various embodiments, the lower junction layer 120 can be a semiconductor material, where the semiconductor material can be a different material from the substrate 110. In a non-limiting exemplary embodiment, the lower junction layer 120 can be silicon-germanium (SiGe), where the germanium concentration can be in the range of about 15 atomic percent (at. %) to about 40 at. %, or about 20 at. % to about 30 at. %, although other concentrations are also contemplated.

In various embodiments, the lower junction layer 120 can have a thickness in a range of about 2 nanometers (nm) to about 10 nm, or about 3 nm to about 7 nm, or about 5 nm, although other thicknesses are also contemplated.

In one or more embodiments, a vertical fin layer 130 can be formed on the top surface of lower junction layer 120, where the vertical fin layer 130 can be formed by epitaxial or heteroepitaxial growth on a crystalline surface of the lower junction layer 120.

In various embodiments, the vertical fin layer 130 can be a semiconductor material, where the semiconductor material can be a different material from the lower junction layer 120. The vertical fin layer 130 can be the same semiconductor material as the substrate 110. In a non-limiting exemplary embodiment, the vertical fin layer 130 can be silicon (Si).

In various embodiments, the vertical fin layer 130 can have a thickness in a range of about 8 nm to about 40 nm, or about 10 nm to about 30 nm, or about 15 nm, although other thicknesses are also contemplated. The vertical fin layer can be about 3× the thickness of the lower junction layer.

In one or more embodiments, an upper junction layer 140 can be formed on the surface of the vertical fin layer 130, where the upper junction layer 140 can be formed by epitaxial or heteroepitaxial growth on a crystalline surface of the vertical fin layer 130.

In various embodiments, the upper junction layer 140 can be a semiconductor material, where the semiconductor material can be a different material from the vertical fin layer 130. The upper junction layer 140 can be the same semiconductor material as the lower junction layer 120. In a non-limiting exemplary embodiment, the upper junction layer 140 can be silicon-germanium (SiGe), where the germanium concentration can be in the range of about 15 atomic percent (at. %) to about 40 at. %, or about 20 at. % to about 30 at. %, although other concentrations are also contemplated. In another non-limiting exemplary embodiment, the vertical fin layer 130 can be, for example, indium-gallium-arsenide (InGaAs) and the upper and lower junction layers 120, 140 can be, for example, indium phosphide (InP) or indium-aluminum-arsenide (InAlAs).

In various embodiments, the upper junction layer 140 can have a thickness in a range of about 2 nanometers (nm) to about 10 nm, or about 3 nm to about 7 nm, or about 5 nm, although other thicknesses are also contemplated.

In one or more embodiments, a substrate 110 can be, for example, a single crystal semiconductor material wafer or a semiconductor-on-insulator stacked wafer. The substrate can include a support layer that provides structural support, and an active semiconductor layer that can form devices. An insulating layer (e.g., a buried oxide (BOX) layer) may be between the active semiconductor layer and the support layer to form a semiconductor-on-insulator substrate (SeOI) (e.g., a silicon-on-insulator substrate (SOI)).

In one or more embodiments, the substrate 110 or an active semiconductor layer can be a crystalline semiconductor, for example, a IV or IV-IV semiconductor (e.g., silicon (Si), silicon carbide (SiC), silicon-germanium (SiGe), germanium (Ge)) or a III-V semiconductor (e.g., gallium-arsenide (GaAs), indium-phosphide (InP), indium-antimonide (InSb)).

In one or more embodiments, a plurality of fin templates 150 can be formed on upper junction layer 140, where the fin templates 150 can be formed by a forming and patterning a lithographic hardmask. The fin templates 150 can be a hardmask material, including, but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), or combinations thereof.

Figure 2:
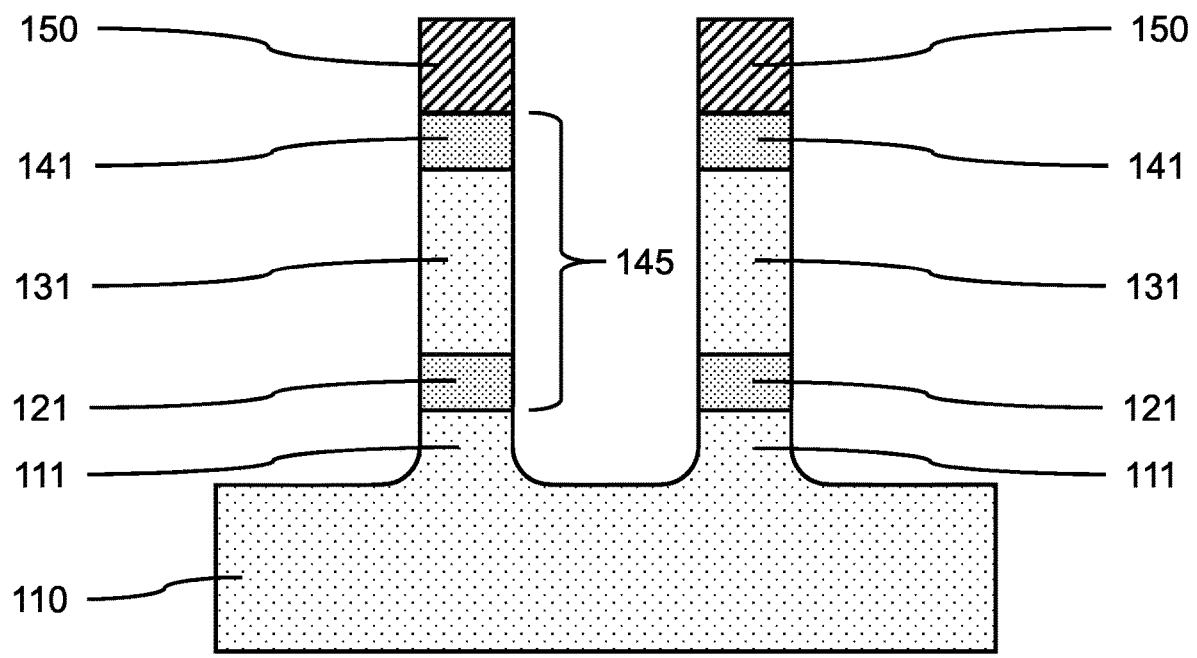
FIG. 2 is a cross-sectional side view showing a supporting pillar, lower junction plate, vertical fin, and upper junction plate on the supporting pillar, below each of the plurality of fin templates, in accordance with an embodiment of the present invention.

FIG. 2 is a cross-sectional side view showing a supporting pillar, lower junction plate, vertical fin, and upper junction plate on the supporting pillar, below each of the plurality of fin templates, in accordance with an embodiment of the present invention.

In one or more embodiments, one or more lower junction plates 121, vertical fins 131, and upper junction plates 141 can be formed as a fin stack 145 on a supporting pillar 111, below each of the plurality of fin templates 150. The lower junction plates 121, vertical fins 131, and upper junction plates 141 can be formed by a multiple patterning fabrication process, for example, a sidewall image transfer (SIT) process, a self-aligned double patterning (SADP) process, self-aligned triple patterning (SATP) process, or a self-aligned quadruple patterning (SAQP). The lower junction plates 121, vertical fins 131, and upper junction plates 141 may be formed by a direct write process or double patterning process using, for example, immersion lithography, extreme ultraviolet lithography, or x-ray lithography.

In various embodiments, the substrate can be recessed as part of the fin stack formation process to create supporting pillars 111 from the substrate underneath each of the one or more lower junction plates 121. The substrate can be recessed using a directional etch, for example, a reactive ion etch (RIE). The supporting pillars 111 can have curved or sloped sides.

In various embodiments, the lower junction plates 121, vertical fins 131, and upper junction plates 141 can have a width in a range of about 10 nm to about 30 nm, or about 12 nm to about 25 nm, or about 15 nm, although other widths are also contemplated. In various embodiments, the initial widths of the lower junction plates 121, vertical fins 131, and upper junction plates 141 can be about three times (3×) a predetermined final width of the lower junction plates 121, vertical fins 131, and upper junction plates 141.

Figure 3:
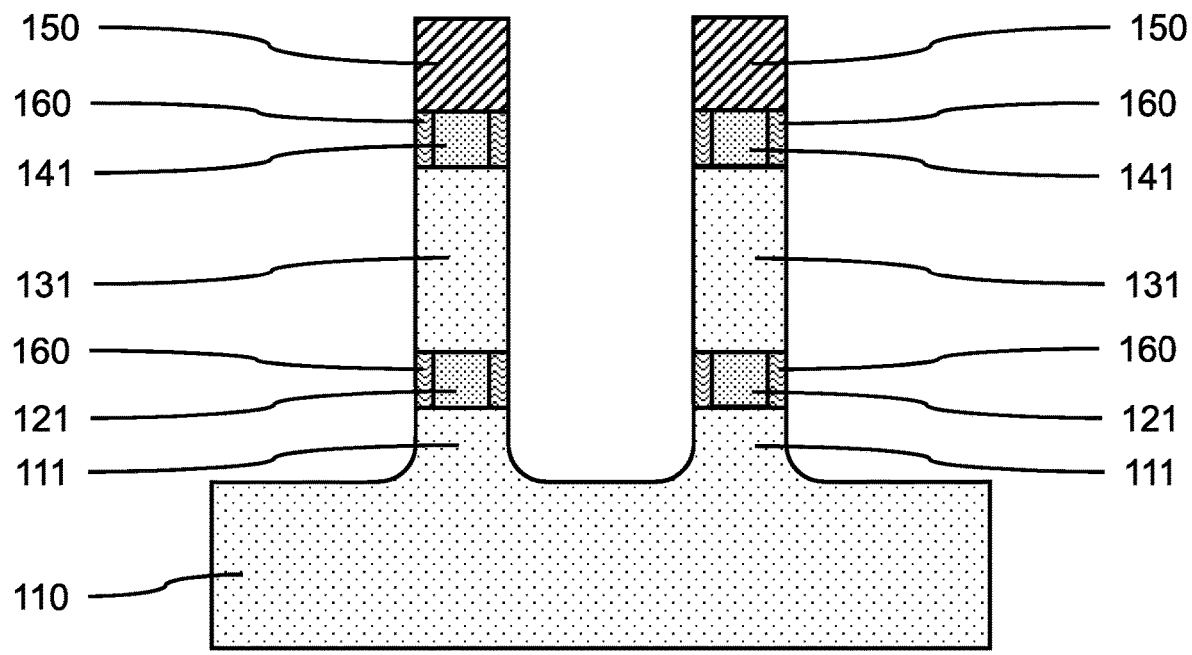
FIG. 3 is a cross-sectional side view showing a portion of the lower junction plate and upper junction plate replaced with an inner spacer, in accordance with an embodiment of the present invention.

FIG. 3 is a cross-sectional side view showing a portion of the lower junction plate and upper junction plate replaced with an inner spacer, in accordance with an embodiment of the present invention.

In one or more embodiments, a portion of the lower junction plate 121 and upper junction plate 141 can be removed using a selective isotropic etch, for example, a wet chemical etch, where the material of the lower junction plate 121 and upper junction plate 141 is removed to a predetermined depth. In various embodiments, the lower junction plate 121 and upper junction plate 141 is removed to a depth in a range of about 2 nm to about 6 nm, or about 4 nm, although other depths are also contemplated.

In one or more embodiments, an inner spacer 160 can be formed in the recessed space formed by removing the portions of the lower junction plate 121 and upper junction plate 141. The inner spacer 160 can be formed by a conformal deposition, for example, atomic layer deposition (ALD) or plasma enhanced ALD (PEALD), where the deposition process fills in the recessed spaces. The material of the inner spacers 160 deposited on the sidewalls and end walls of the fin templates 150 and vertical fins 131 can be etched back using a directional etch and/or an isotropic etch. In various embodiments, the inner spacers 160 can surround the lower junction plate 121 and upper junction plate 141, where the lower inner spacer can protect the lower junction plate 121 and the upper inner spacer can protect the upper junction plate 141 during subsequent processes.

In various embodiments, the inner spacers 160 can be a dielectric material, including, but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), or combinations thereof. In a non-limiting exemplary embodiment, the protective liner 130 can be stoichiometric silicon nitride (SiBCN). The material of the inner spacers 160 can be different from the fin templates 150 and other layers, so the inner spacers 160 can be selectively etchable.

Figure 4:
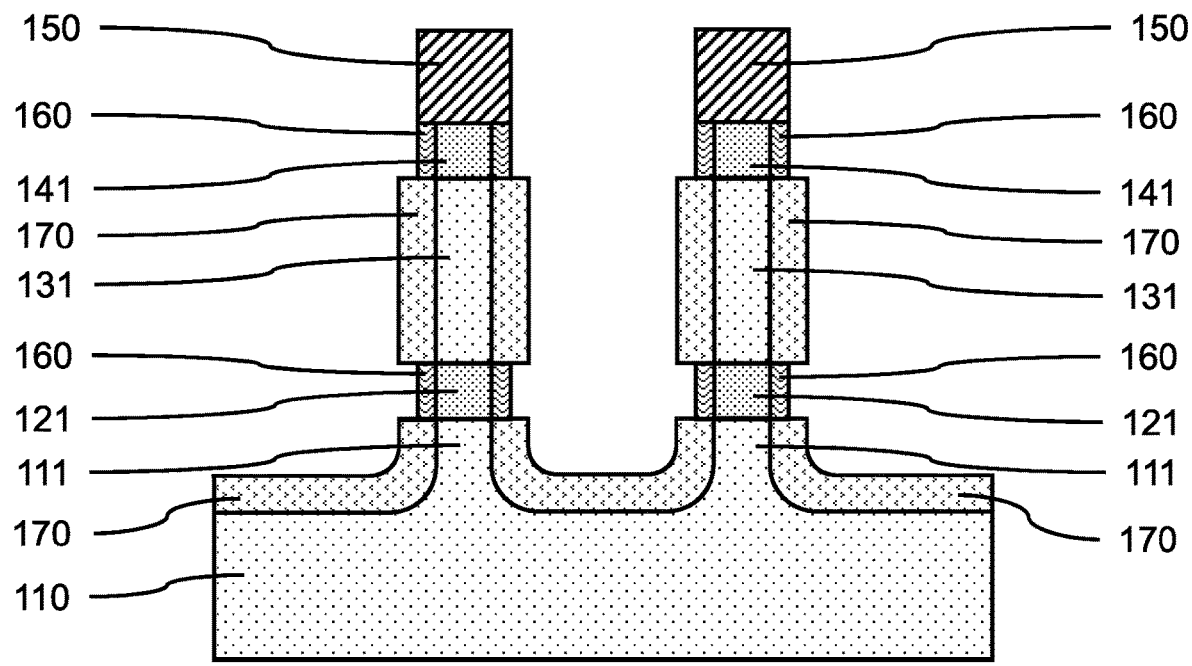
FIG. 4 is a cross-sectional side view showing a sacrificial layer formed from a portion of the vertical fins and substrate, in accordance with an embodiment of the present invention.

FIG. 4 is a cross-sectional side view showing a sacrificial layer formed from a portion of the vertical fins and substrate, in accordance with an embodiment of the present invention.

In one or more embodiments, a sacrificial layer 170 can be formed on the exposed surfaces of the vertical fins 131, supporting pillars 111, and substrate 110. The sacrificial layer 170 can be formed by an oxidation process, where a portion of the vertical fins 131, supporting pillars 111, and substrate 110 can be consumed during formation of a silicon oxide (SiO) sacrificial layer 170. The oxidation process can consume sufficient amounts of the vertical fins 131 and supporting pillars 111 to reduce the widths to be about the same as the lower junction plate 121 and upper junction plate 141. The oxidation process can also increase the recess depth of the substrate 110, thereby increasing the height of the supporting pillars 111 below the lower junction plate 121. The sacrificial layer 170 can have a thickness greater than the thickness of the vertical fin 131 consumed.

In various embodiments, the oxidation process can be conducted at a temperature in the range of about 800° C. to about 1100° C., or about 900° C. to about 1000° C. The oxidation process can be conducted for a duration in a range of about 100 seconds (sec) to about 600 sec. In various embodiments, the oxidation process can be conducted in an oxidizing atmosphere including an oxidizing species, for example, water ($H_2O$), oxygen ($O_2$), ozone ($O_3$), an oxygen plasma, or combinations thereof, where the oxidation can be a wet or dry process.

In various embodiments, the vertical fins 131, supporting pillars 111, and substrate 110 can be recessed using an isotropic etch, for example, a wet chemical etch or dry plasma etch, and a silicon dioxide ($SiO_2$) layer can be formed on the recessed surfaces, for example, using a conformal deposition and directional etch-back (e.g., RIE), rather than the oxidation process.

In various embodiments, the sacrificial layer 170 can surround the vertical fins 131 and supporting pillars 111, and be on the substrate 110, where the thickness of the sacrificial layer 170 can act as a spacer for subsequently formed layers.

Figure 5:
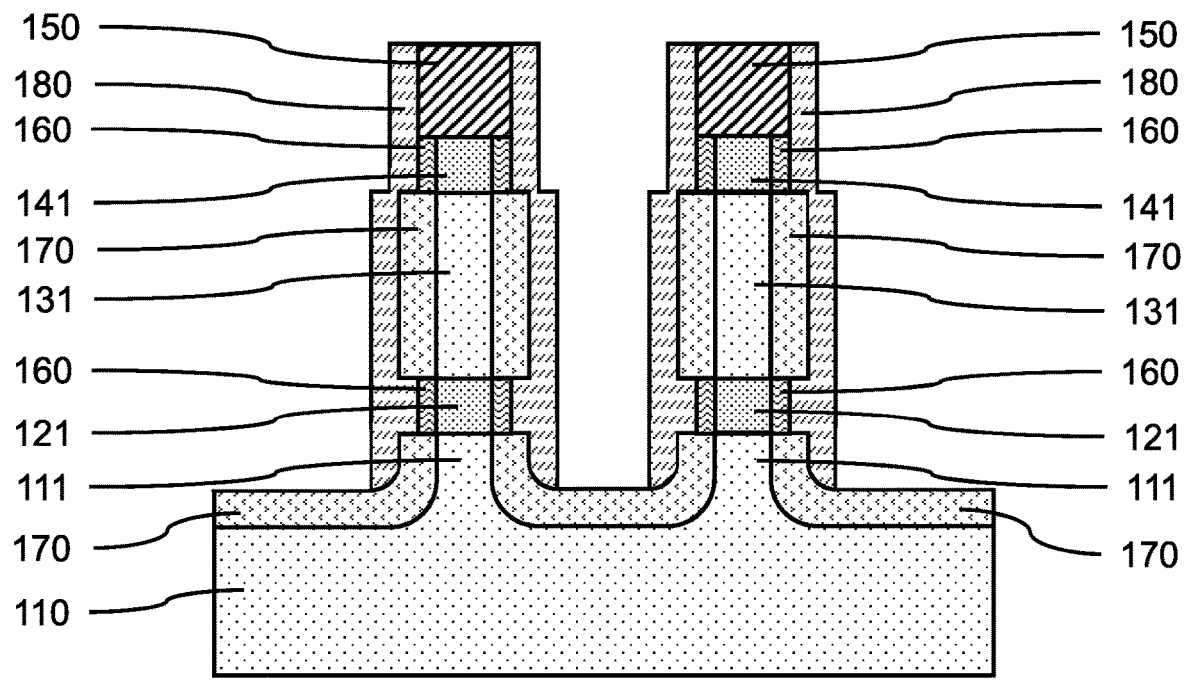
FIG. 5 is a cross-sectional side view showing a protective liner formed on the sacrificial layer, inner spacers, and fin templates, in accordance with an embodiment of the present invention.

FIG. 5 is a cross-sectional side view showing a protective liner formed on the sacrificial layer, inner spacers, and fin templates, in accordance with an embodiment of the present invention.

In one or more embodiments, a protective liner 180 can be formed on the sacrificial layer 170, inner spacers 160, and fin templates 150, where the protective liner 180 can be formed by a conformal deposition (e.g., ALD, PEALD). Portions of the protective liner 180 on horizontal surfaces can be removed using a selective directional etch (e.g., RIE) to expose the sacrificial layer 170 on the substrate 110 and the top surface of the fin templates 150. Portions of the protective liner 180 can remain on the sidewalls of the inner spacers 160 and sacrificial layer 170 on the vertical fins 131. Portions of the protective liner can remain adjacent to sacrificial layer on the supporting pillars.

In various embodiments, the protective liner 180 can be a dielectric material, including, but not limited to, silicon nitride (SiN), silicon carbonitride (SiCN), silicon boronitride (SiBN), silicon borocarbide (SiBC), silicon boro carbonitride (SiBCN), or combinations thereof. The protective liner 180 can be a different material from the sacrificial layer 170 and inner spacers 160 to allow selective removal of the protective liner 180 and sacrificial layer 170. In a non-limiting exemplary embodiment, the protective liner 180 can be stoichiometric silicon nitride (SiN).

In various embodiments, the protective liner 180 can surround the sacrificial layer 170 on the vertical fins 131 and a portion of sacrificial layer on the supporting pillars, and inner spacers.

Figure 6:
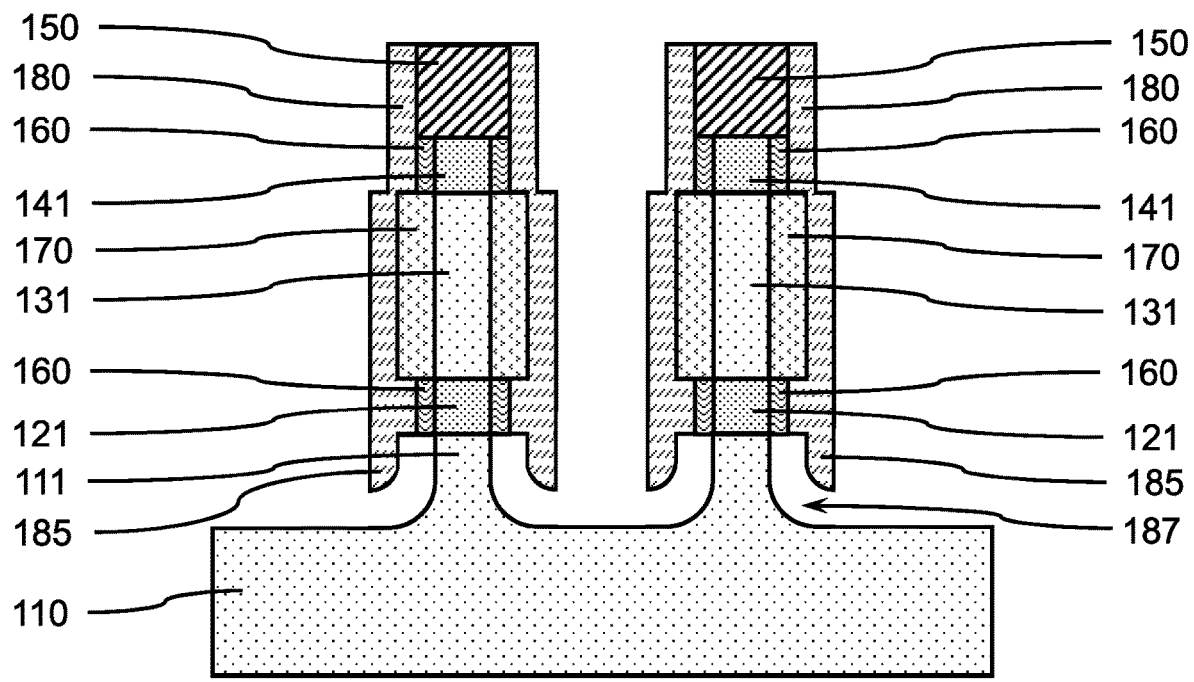
FIG. 6 is a cross-sectional side view showing the protective liner on a segment of the sacrificial layer after removing an exposed portion of the sacrificial layer, in accordance with an embodiment of the present invention.

FIG. 6 is a cross-sectional side view showing the protective liner on a segment of the sacrificial layer after removing an exposed portion of the sacrificial layer, in accordance with an embodiment of the present invention.

In one or more embodiments, a portion of the sacrificial layer 170 on the substrate 110 and supporting pillars 111 can be removed using a selective, isotropic etch, whereas a segment of the sacrificial layer 170 covered by the protective liner 180 can remain on the vertical fins 131. The removal of the portion of the sacrificial layer 170 can leave a hanging portion 185 of the protective liner 180 extending below the inner spacers 160. A gap 187 can be formed between the hanging portion 185 and the adjacent supporting pillars 111 by removal of the portion of the sacrificial layer.

Figure 7:
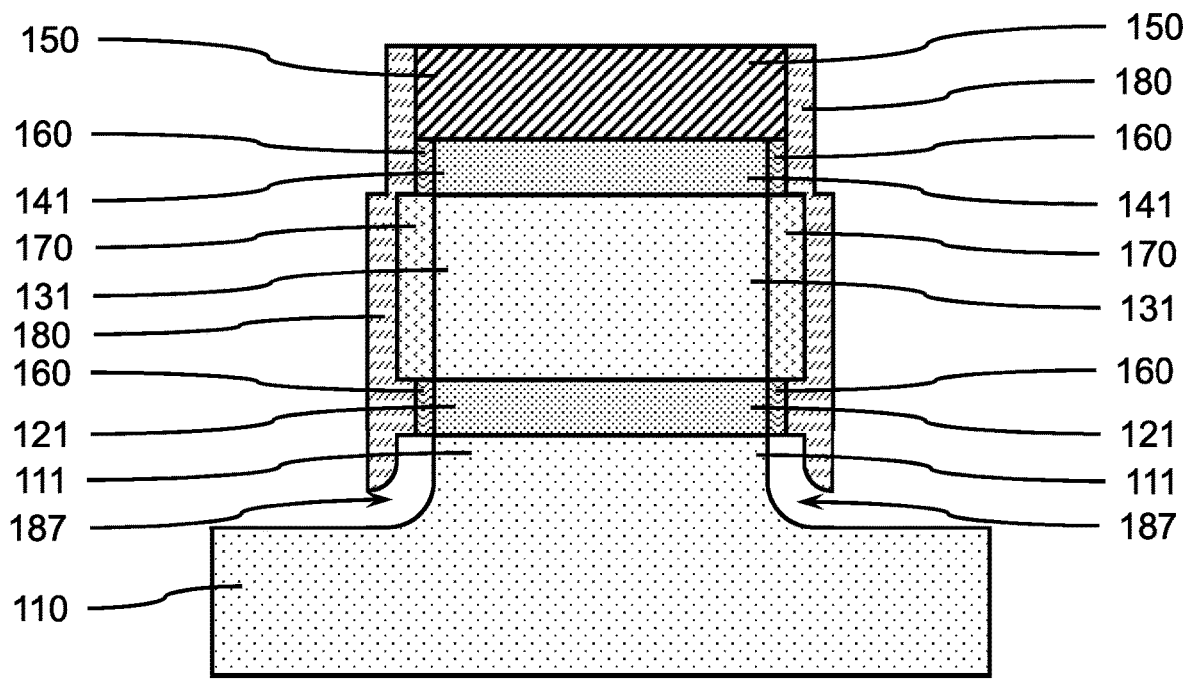
FIG. 7 is a cross-sectional side view along the long axis of a vertical fin showing a segment of the sacrificial layer remaining on the vertical fins after removing an exposed portion of the sacrificial layer, in accordance with an embodiment of the present invention.

FIG. 7 is a cross-sectional side view along the long axis of a vertical fin showing a segment of the sacrificial layer remaining on the vertical fins after removing an exposed portion of the sacrificial layer, in accordance with an embodiment of the present invention.

In various embodiments, the gap 187 and hanging portion 185 can surround the supporting pillars 111, where the gap separates the hanging portion 185 from the adjacent supporting pillars.

Figure 8:
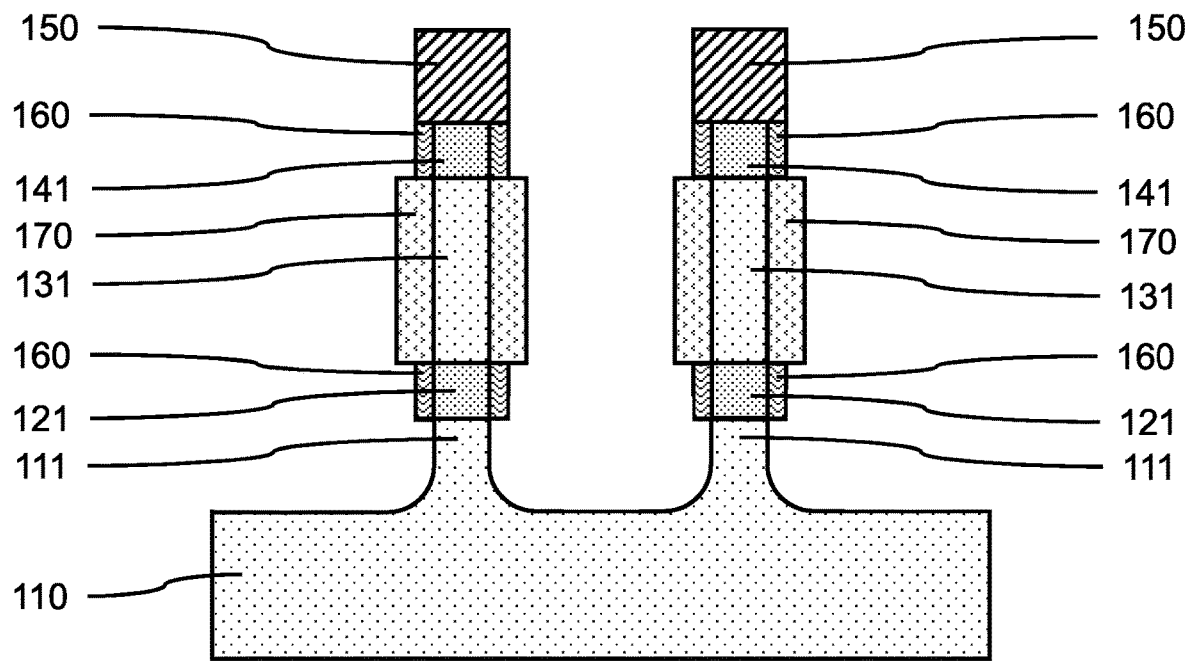
FIG. 8 is a cross-sectional side view showing the portion of the sacrificial layer on the vertical fins after removing the protective liner, in accordance with an embodiment of the present invention.

FIG. 8 is a cross-sectional side view showing the portion of the sacrificial layer on the vertical fins after removing the protective liner, in accordance with an embodiment of the present invention.

In one or more embodiments, the protective liner 180 with the hanging portion 185 can be removed using a selective, isotropic etch (e.g., wet chemical etch, dry plasma etch). The segments of the sacrificial layer 170 and the inner spacers 160 can be exposed by removing the protective liner 180.

Figure 9:
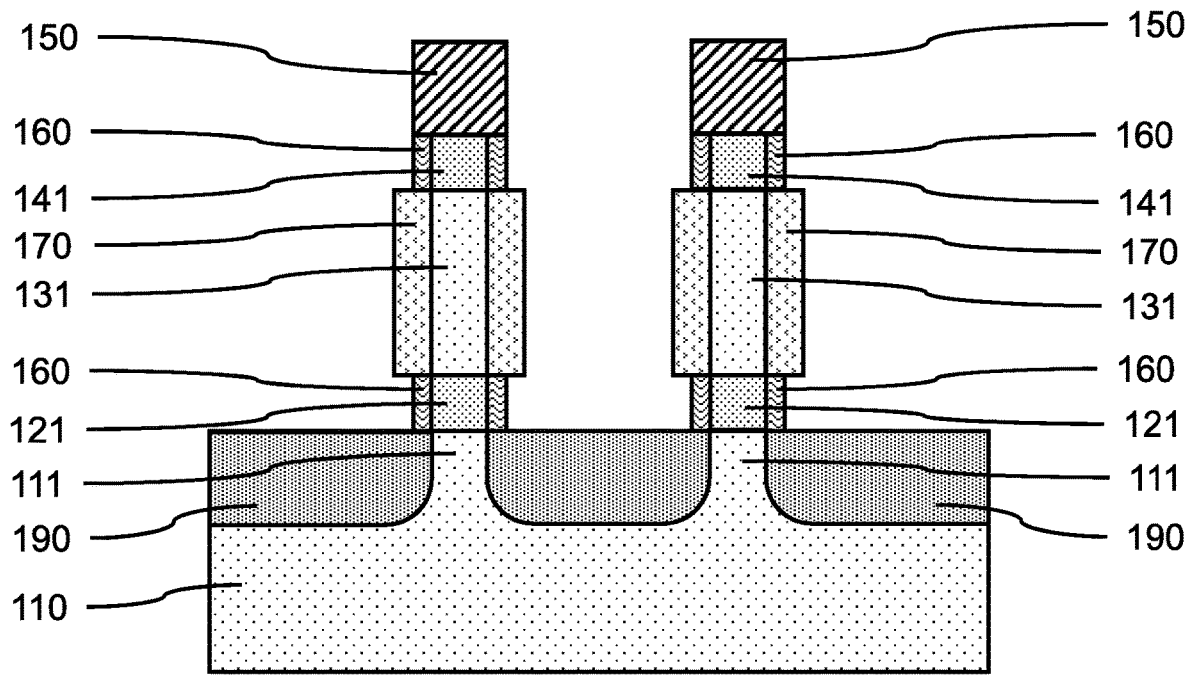
FIG. 9 is a cross-sectional side view showing a doped layer formed adjacent to the supporting pillars and below the inner spacers and lower junction plate, in accordance with an embodiment of the present invention.

FIG. 9 is a cross-sectional side view showing a doped layer formed adjacent to the supporting pillars and below the inner spacers and lower junction plate, in accordance with an embodiment of the present invention.

In one or more embodiments, a doped layer 190 can be formed adjacent to the supporting pillars 111 and below the inner spacers 160 and lower junction plate 121, where the doped layer 190 can be formed by epitaxial or heteroepitaxial growth on a crystalline surface of the substrate 110 and/or supporting pillars 111. In a non-limiting exemplary embodiment, the doped layer 190 can be formed vertically from the substrate 110.

In various embodiments, the doped layer 190 can be a suitably doped to form an n-type or p-type bottom source/drain. In various embodiments, the doped layer 190 can be a semiconductor material, including, but not limited to n-type (e.g., P or As) doped silicon (Si) or p-type (e.g., B) doped silicon-germanium (SiGe).

In various embodiments, the doped layer 190 can have a thickness in a range of about 15 nm to about 30 nm, or about 20 nm to about 25 nm, although other thicknesses are also contemplated. In various embodiments, the doped layer 190 extends up to the bottom surface of the inner spacers 160, where the doped layer 190 can grow epitaxially from the sidewalls of the supporting pillars 111, as well as from the substrate surface depending on the growth parameters.

Figure 10:
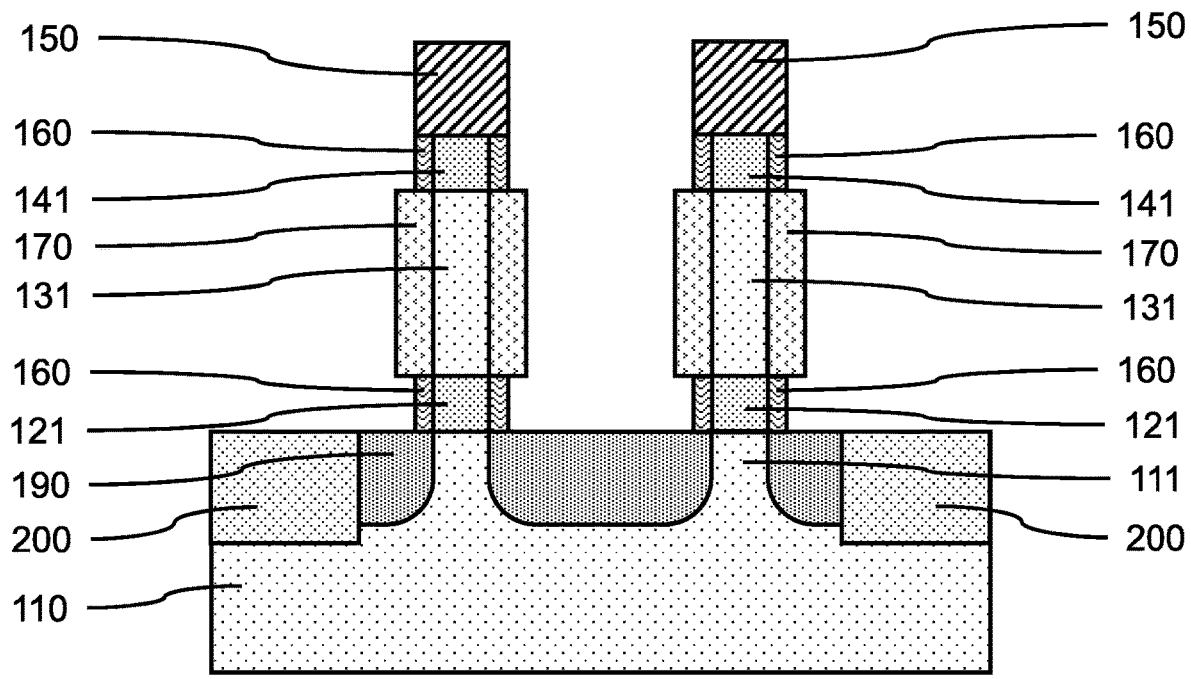
FIG. 10 is a cross-sectional side view showing isolation regions formed in the doped layer and substrate, in accordance with an embodiment of the present invention.

FIG. 10 is a cross-sectional side view showing isolation regions formed in the doped layer and substrate, in accordance with an embodiment of the present invention.

In one or more embodiments, isolation regions 200 can be formed in the doped layer 190 and substrate 110, where the isolation regions 200 can be formed by masking and patterning a resist layer using lithographic techniques, and removing exposed portions of the doped layer 190 and substrate 110 to form isolation trenches. The isolation trenches can be filled with a dielectric material, including, but not limited to, silicon oxide (SiO), silicon nitride (SiN), or a low-k dielectric material to form isolation regions 200 in the doped layer 190 and substrate. A low-k dielectric material can include, but not be limited to, silicon oxynitride (SiON), silicon-carbon-nitride (SiCN), boron nitride (BN), silicon boron nitride (SiBN), silicon boron carbonitride (SiBCN), silicon oxycabonitride (SiOCN), carbon doped silicon oxide (SiO:C), fluorine doped silicon oxide (SiO:F), polymeric material, for example, tetraethyl orthosilicate (TEOS), hydrogen silsesquioxane (HSQ) and methylsilsesquioxane (MSQ), and combinations thereof. The dielectric material can be formed by a blanket deposition, for example, chemical vapor deposition (CVD), or spin-on, and etched back to form the isolation regions 200 in the isolation trenches.

Figure 11:
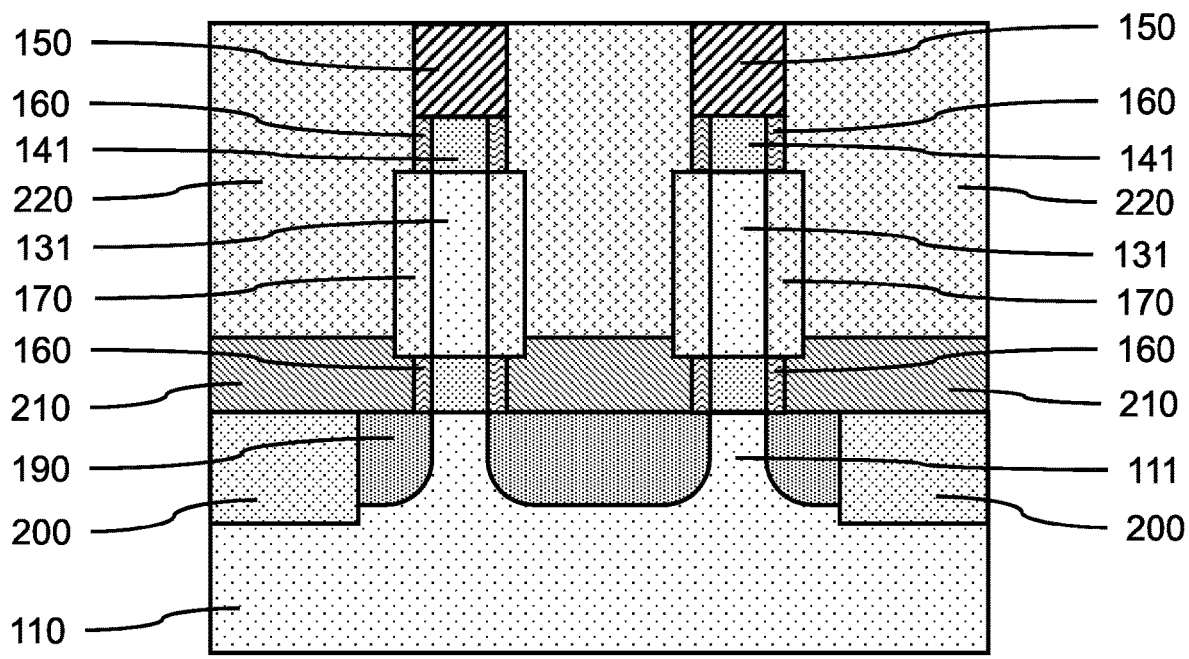
FIG. 11 is a cross-sectional side view showing a bottom spacer layer formed on the isolation regions and doped layer, and a fill layer formed on the bottom spacer layer, in accordance with an embodiment of the present invention.

FIG. 11 is a cross-sectional side view showing a bottom spacer layer formed on the isolation regions and doped layer, and a fill layer formed on the bottom spacer layer, in accordance with an embodiment of the present invention.

In one or more embodiments, a bottom spacer layer 210 can be formed on the isolation regions 200 and doped layer 190, where the bottom spacer layer 210 can be formed by an isotropic deposition (e.g., CVD, plasma enhanced CVD (PECVD)), and etched back, so the bottom spacer layer 210 is formed under the inner spacers 160.

In various embodiments, the bottom spacer layer 210 can be a hardmask material, including, but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), or combinations thereof.

In various embodiments, the bottom spacer layer 210 can be formed to a thickness greater then height between the top surface of the doped layer 190 and the bottom surface of the sacrificial layer 170, so the bottom spacer layer 210 can cover a lower portion of the sacrificial layer 170. In various embodiments, the bottom spacer layer 210 can have a thickness in a range of about 4 nm to about 10 nm, or about 6 nm to about 8 nm, although other thicknesses are contemplated. The bottom spacer layer 210 can have a thickness greater than the thickness of the lower junction layer 120.

In one or more embodiments, a fill layer 220 can be formed on the bottom spacer layer 210, where the fill layer 220 can be formed by a blanket deposition. Portions of the fill layer 220 extending above the fin templates can be removed using a chemical-mechanical polishing (CMP) to expose the top surfaces of the fin templates 150.

In various embodiments, the fill layer 220 can be silicon oxide (SiO), silicon nitride (SiN), a low-k dielectric material, or combinations thereof. The fill layer 220 can be the same material as sacrificial layer 170, so the fill layer 220 and sacrificial layer 170 can be removed at the same time using a selective etch. The fill layer 220 and sacrificial layer 170 can both be silicon oxide (SiO).

Figure 12:
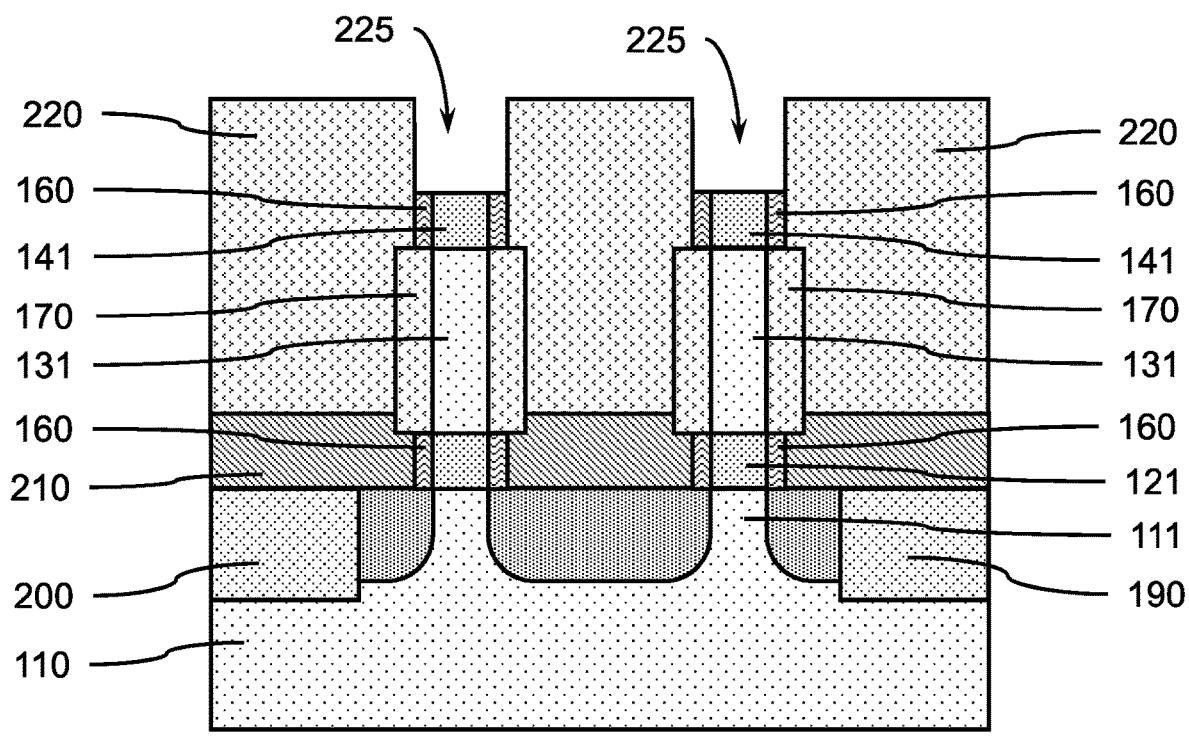
FIG. 12 is a cross-sectional side view showing openings formed in the fill layer by removing the fin templates, in accordance with an embodiment of the present invention.

FIG. 12 is a cross-sectional side view showing openings formed in the fill layer by removing the fin templates, in accordance with an embodiment of the present invention.

In one or more embodiments, openings 225 can be formed in the fill layer 220 by removing the fin templates 150. Removing the fin templates 150 can expose the upper junction plates 141 and top surfaces of upper inner spacers 160, as well as sidewalls of the fill layer 220. The fin templates 150 can be removed using a selective directional or isotropic etch.

Figure 13:
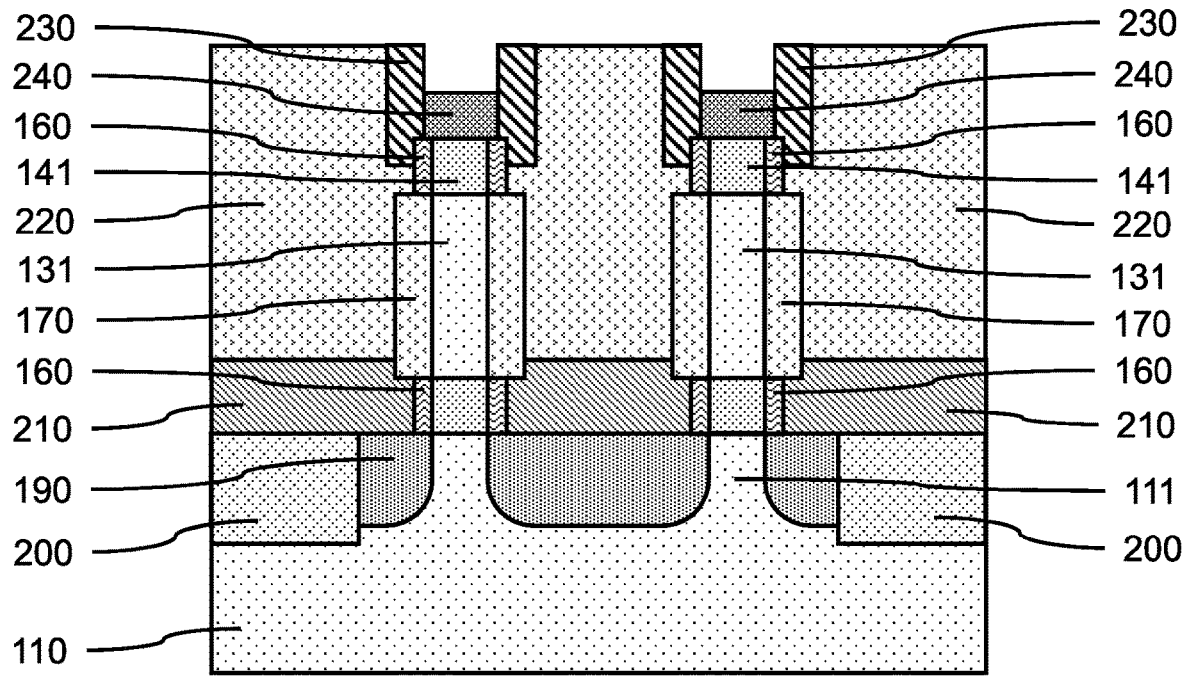
FIG. 13 is a cross-sectional side view showing protective spacers formed in widened openings on the inner spacers, and an upper doped plug formed on the upper junction plate, in accordance with an embodiment of the present invention.

FIG. 13 is a cross-sectional side view showing protective spacers formed in widened openings on the inner spacers, and an upper doped plug formed on the upper junction plate, in accordance with an embodiment of the present invention.

In one or more embodiments, openings 225 can be widened using an isotropic etch, or lithographic processes and a directional etch to further expose portions of the inner spacers 160.

In one or more embodiments, protective spacers 230 can be formed in the widened opening 225 on the upper inner spacers 160, where the protective spacers 230 can be formed by a conformal deposition and directional etch-back to expose the upper surface of the upper junction plate 141.

In various embodiments, the protective spacers 230 can be a hardmask material, including, but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), or combinations thereof.

In one or more embodiments, an upper doped plug 240 can be formed on exposed portions of the upper junction plate 141 and inner spacers 160, where the upper doped plug 240 can be formed by epitaxial or heteroepitaxial growth on a crystalline surface of the upper junction plate 141.

In various embodiments, the upper doped plug 240 can be a suitably doped to form an n-type or p-type top source/drain. In various embodiments, the upper doped plug 240 can be a semiconductor material, including, but not limited to n-type (e.g., P or As) doped silicon (Si) or p-type (e.g., B) doped silicon-germanium (SiGe).

In one or more embodiments, isolation regions 200 and doped layer 190 can surround the supporting pillar 111, where the lateral distance between the supporting pillar and isolation regions can be asymmetric, such that a greater portion of the doped layer 190 is exposed on one side.

Figure 14:
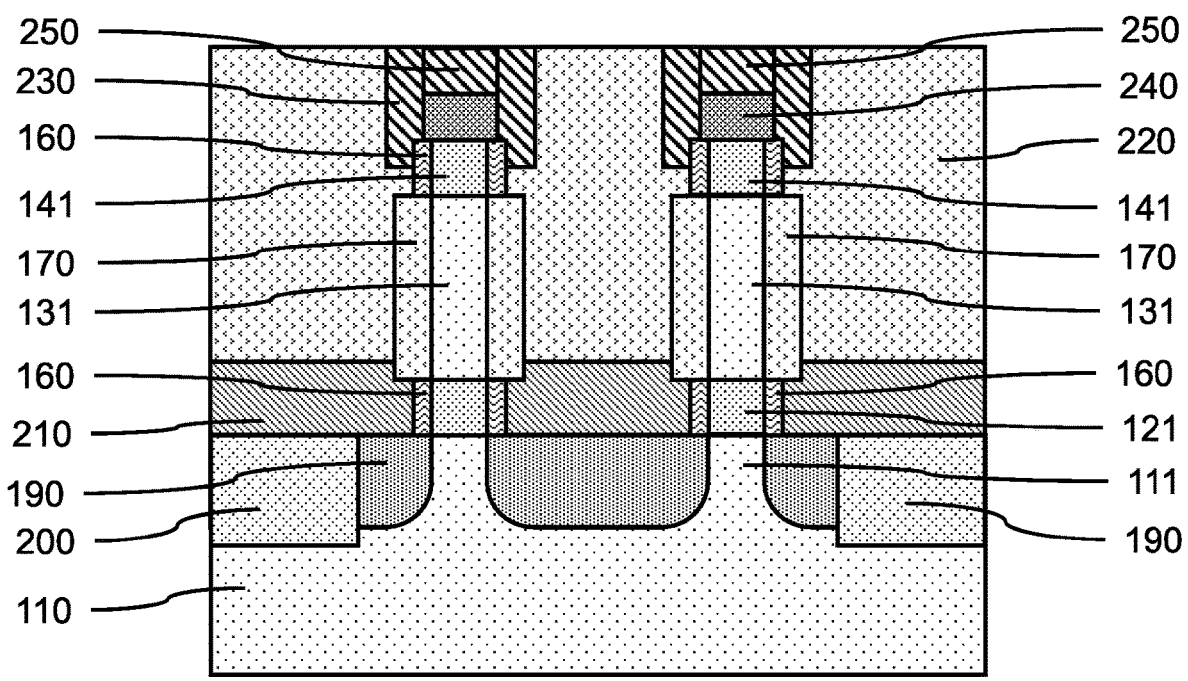
FIG. 14 is a cross-sectional side view showing a protective cap formed on the upper doped plug between the protective spacers, in accordance with an embodiment of the present invention.

FIG. 14 is a cross-sectional side view showing a protective cap formed on the upper doped plug between the protective spacers, in accordance with an embodiment of the present invention.

In one or more embodiments, a protective cap 250 can be formed on the upper doped plug 240, where the protective cap 250 can be formed by a blanket deposition and excessive material etched back or removed by CMP. The protective cap 250 can be the same dielectric material as the protective spacers 230.

Figure 15:
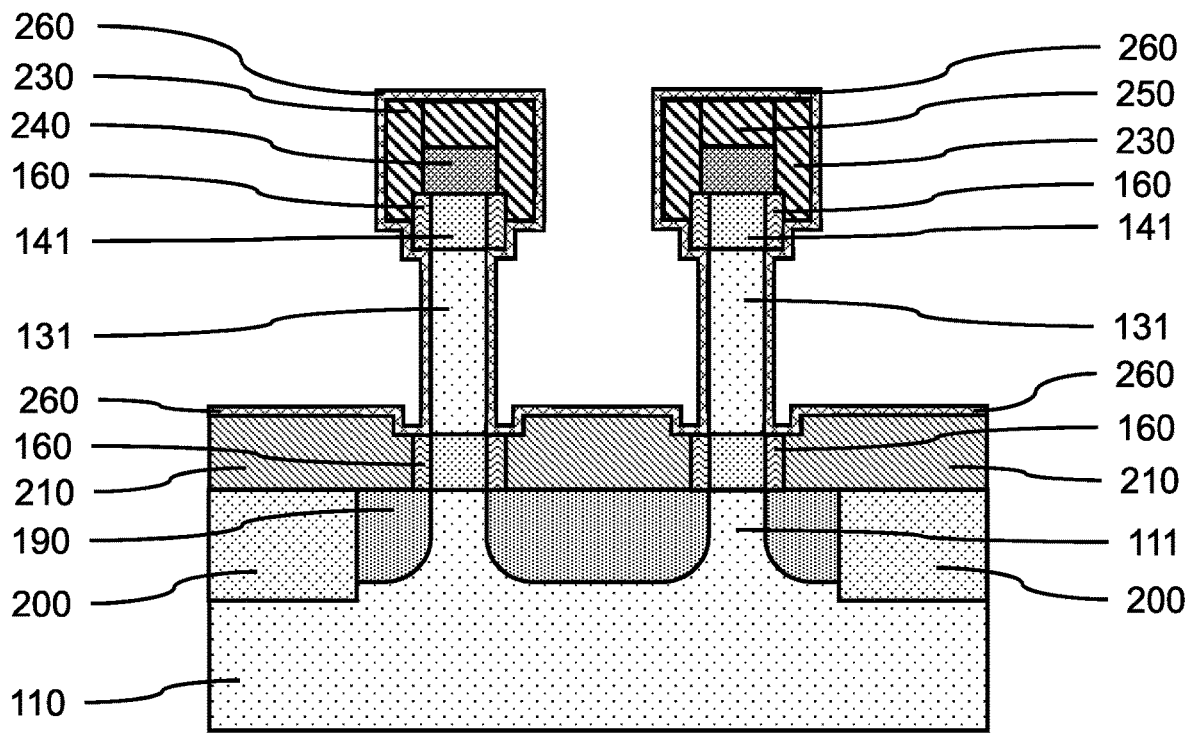
FIG. 15 is a cross-sectional side view showing a dielectric gate layer formed on the protective cap, protective spacers, vertical fins, and bottom spacer layer, in accordance with an embodiment of the present invention.

FIG. 15 is a cross-sectional side view showing a dielectric gate layer formed on the protective cap, protective spacers, vertical fins, and bottom spacer layer, in accordance with an embodiment of the present invention.

In one or more embodiments, the fill layer 220 and sacrificial layer 170 can be removed at the same time using a selective isotropic etch to expose the bottom spacer layer 210, protective spacers 230, and the vertical fins 131. The removal of the sacrificial layer 170 can form recessed surfaces in the bottom spacer layer 210 around the vertical fins 131.

In one or more embodiments, a dielectric gate layer 260 can be formed on the protective cap 250, protective spacers 230, vertical fins 131, and bottom spacer layer 210, where the dielectric gate layer 260 can be formed by a conformal deposition.

In various embodiments, the gate dielectric layer 260 can be a dielectric material, including, but not limited to, silicon oxide (SiO), silicon nitride (SiN), silicon oxynitride (SiON), silicon boronitride (SiBN), silicon boro carbonitride (SiBCN), silicon carbonitride (SiCN), silicon oxycarbonitride (SiOCN), a high-k dielectric, and combinations thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), yttrium oxide (YO), and aluminum oxide (AlO). The high-k material may further include dopants such as lanthanum, aluminum, magnesium, or combinations thereof.

Figure 16:
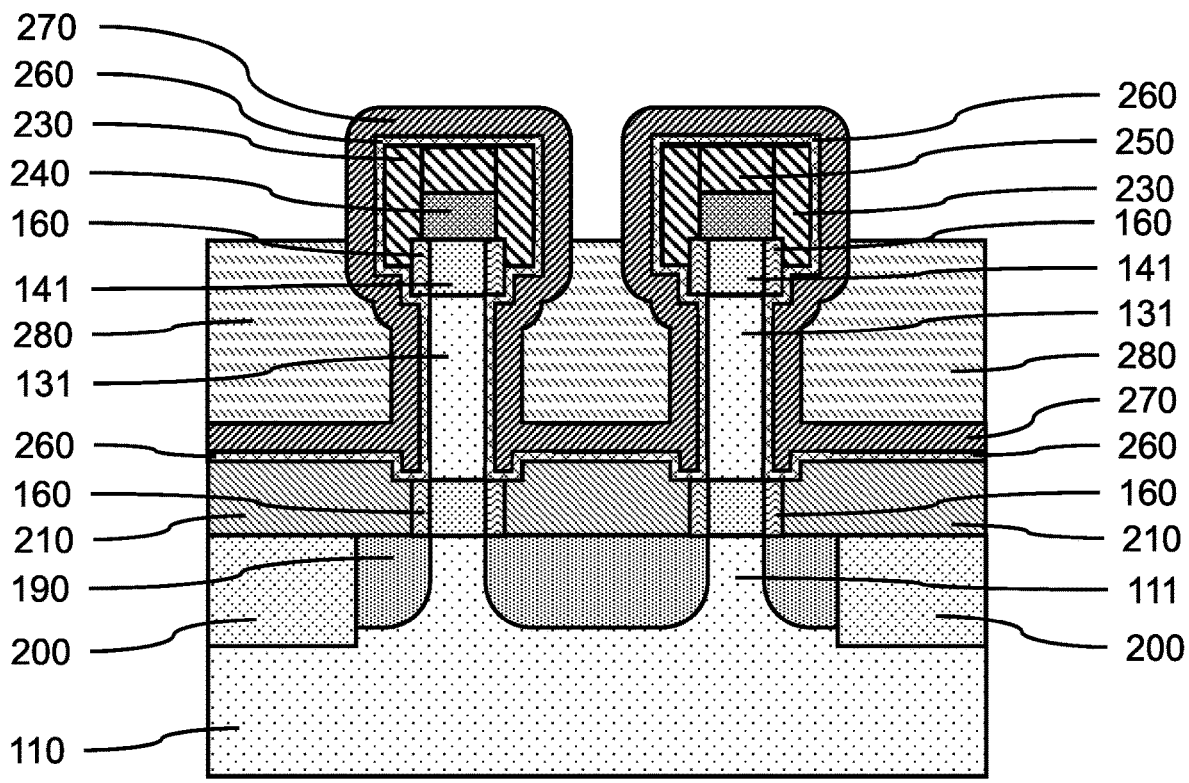
FIG. 16 is a cross-sectional side view showing a work function layer formed on the dielectric gate layer, and a gauge layer formed on the work function layer, in accordance with an embodiment of the present invention.

FIG. 16 is a cross-sectional side view showing a work function layer formed on the dielectric gate layer, and a gauge layer formed on the work function layer, in accordance with an embodiment of the present invention.

In one or more embodiments, a work function layer 270 can be formed on the dielectric gate layer 260, where the work function layer 270 can be formed by a conformal deposition. The work function layer 270 can be a conducting metallic compound material, for example, tantalum nitride (TaN), titanium nitride (TiN), tantalum carbide (TaC), titanium carbide (TiC), titanium aluminum carbide (TiAlC), and combinations thereof.

In one or more embodiments, a gauge layer 280 can be formed on the work function layer 270, where the gauge layer 280 can be formed by a blanket deposition and etched back using a directional etch (e.g., RIE). The gauge layer 280 can be etched back to a predetermined height to expose portions of the work function layer 270 above the top surfaces of the upper junction plates 141. The gauge layer 280 can be a dielectric material.

Figure 17:
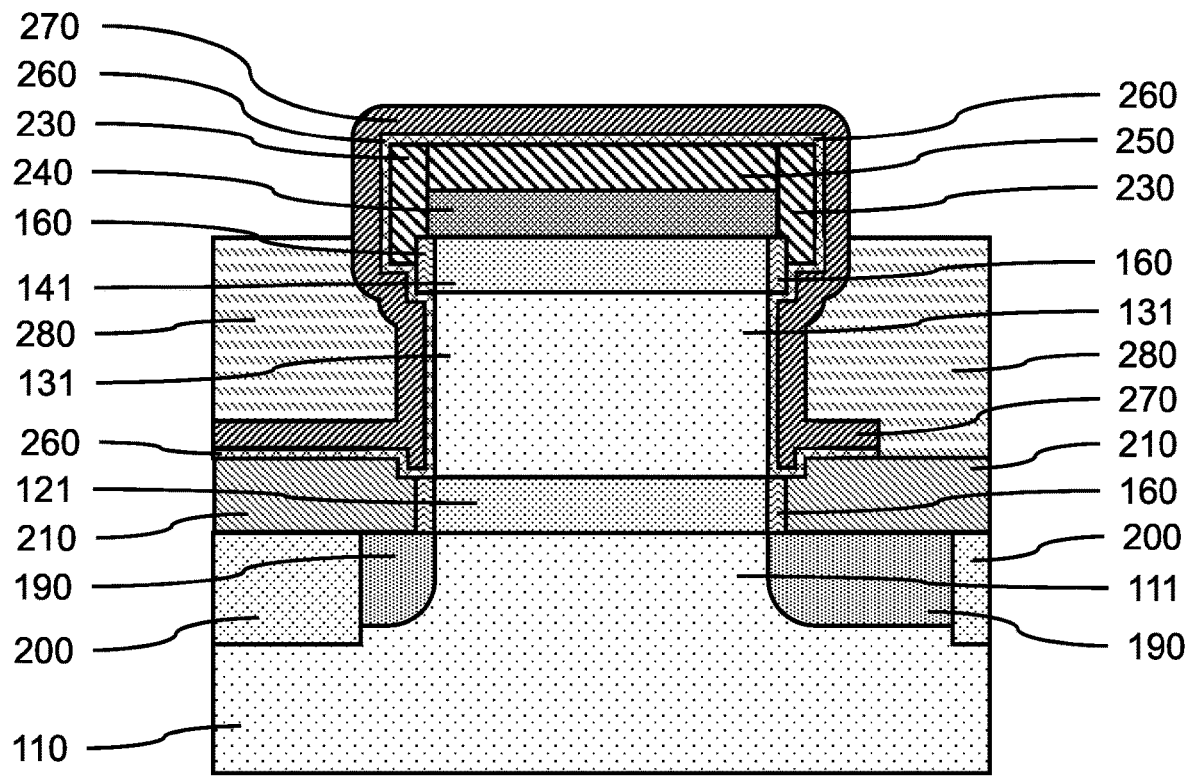
FIG. 17 is a cross-sectional side view along the long axis of a vertical fin showing a work function layer formed on the dielectric gate layer, and a gauge layer formed on the work function layer, in accordance with an embodiment of the present invention.

FIG. 17 is a cross-sectional side view along the long axis of a vertical fin showing a work function layer formed on the dielectric gate layer, and a gauge layer formed on the work function layer, in accordance with an embodiment of the present invention.

The gauge layer 280 can surround the vertical fins 131 and work function layer 270.

Figure 18:
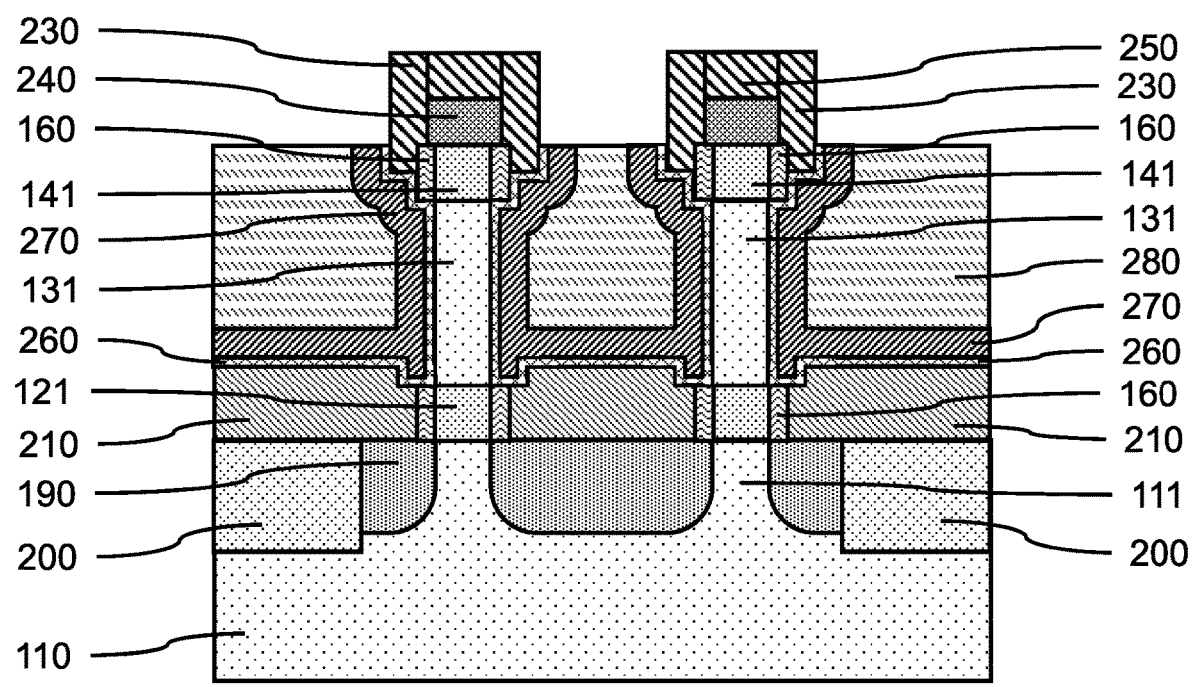
FIG. 18 is a cross-sectional side view showing portion of the work function layer and dielectric gate layer above the gauge layer removed to expose the protective cap and protective spacers, in accordance with an embodiment of the present invention.

FIG. 18 is a cross-sectional side view showing portion of the work function layer and dielectric gate layer above the gauge layer removed to expose the protective cap and protective spacers, in accordance with an embodiment of the present invention.

In one or more embodiments, the portions of the work function layer 270 exposed above the top surface of the gauge layer 280 can be removed using a selective isotropic etch to expose the underlying portion of the gate dielectric layer 260. The gate dielectric layer 260 exposed above the top surface of the gauge layer 280 can be removed using a selective isotropic etch to expose the underlying portion of the protective spacers 230 and the protective cap 250.

Figure 19:
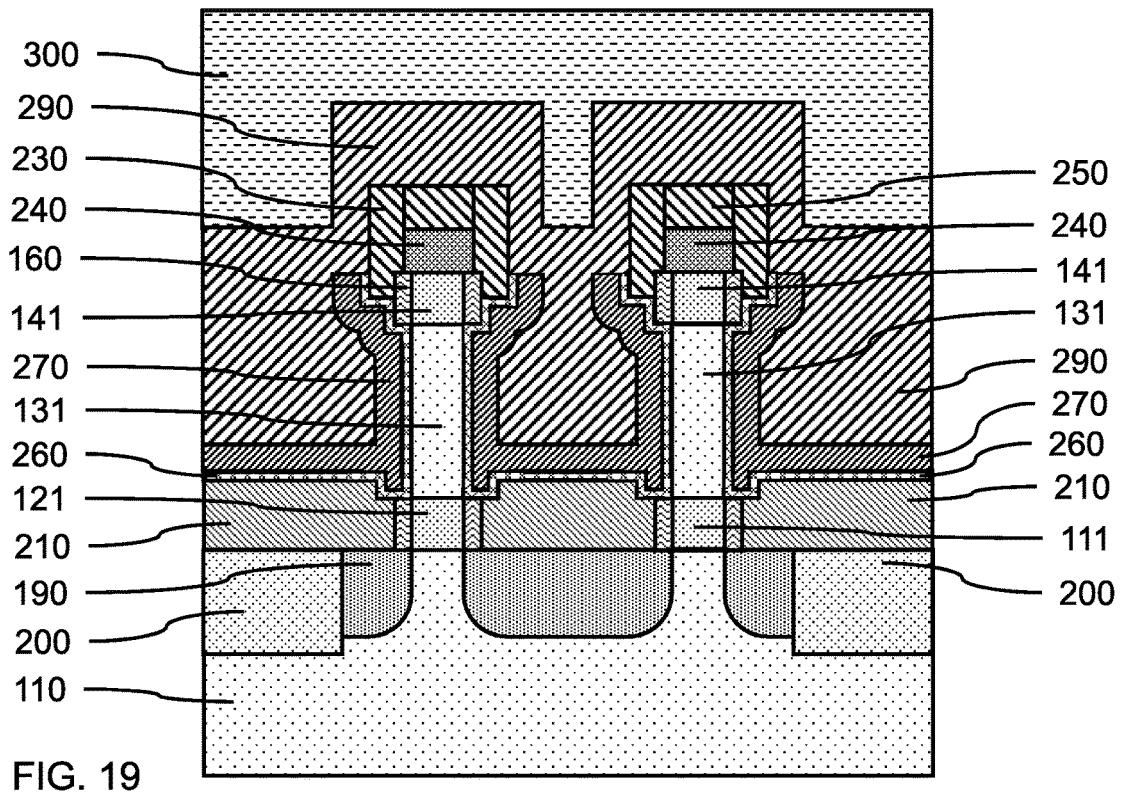
FIG. 19 is a cross-sectional side view showing the gauge layer replaced with a cover layer, and an interlayer dielectric (ILD) layer formed on the cover layer, in accordance with an embodiment of the present invention.

FIG. 19 is a cross-sectional side view showing the gauge layer replaced with a cover layer, and an interlayer dielectric (ILD) layer formed on the cover layer, in accordance with an embodiment of the present invention.

In one or more embodiments, the gauge layer 280 can be removed with a selective isotropic etch, and a cover layer 290 can be formed on the exposed surfaces. The cover layer 290 can cover the protective spacers 230 and the protective cap 250.

In various embodiments, the cover layer 290 can be a dielectric material, including but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), or combinations thereof.

In one or more embodiments, an interlayer dielectric (ILD) layer 300 can be formed on the cover layer 290, where the interlayer dielectric (ILD) layer 300 can be formed by a blanket deposition. The ILD layer 300 can be silicon oxide (SiO), a low-k dielectric material, or combinations thereof.

Figure 20:
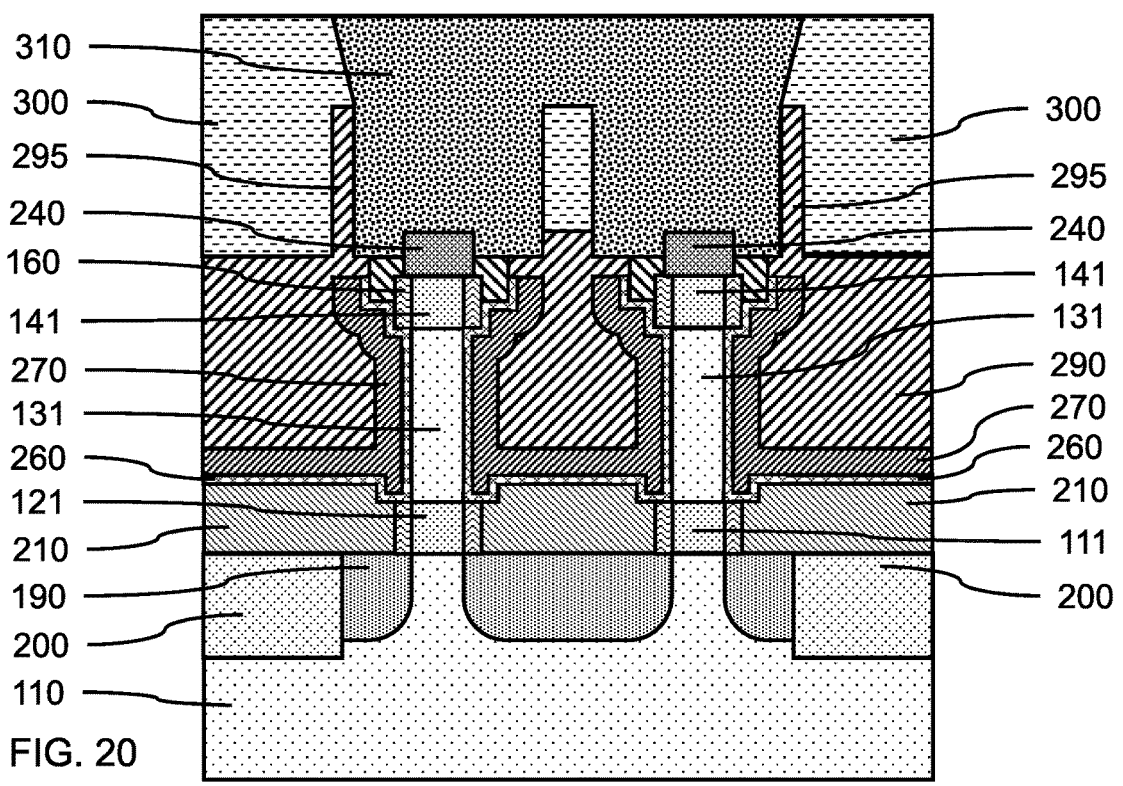
FIG. 20 is a cross-sectional side view showing contact openings and electrical contacts formed in the interlayer dielectric (ILD) layer, in accordance with an embodiment of the present invention.

FIG. 20 is a cross-sectional side view showing contact openings and electrical contacts formed in the interlayer dielectric (ILD) layer, in accordance with an embodiment of the present invention.

In on e or more embodiments, contact openings and electrical contacts 310 can be formed in the interlayer dielectric (ILD) layer using lithographic techniques and a blanket deposition, for example metal-organic CVD (MOCVD).

In various embodiments, the electrical contacts 310 can be a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, or any suitable combination of these materials.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C).

This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating a device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a vertical field effect transistor device, comprising:
    forming one or more fin stacks on a substrate, wherein the fin stacks include a lower junction plate, a vertical fin on the top surface of the lower junction plate, and an upper junction plate on the top surface of the vertical fin;
    removing a portion of the lower junction plate and upper junction plate to form recessed spaces;
    forming an inner spacer in the recessed spaces;
    forming a sacrificial layer on the exposed surfaces of the vertical fin and the substrate;
    forming a protective liner on the sacrificial layer and inner spacers; and
    removing the portion of the sacrificial layer on the surface of the substrate to leave a hanging portion of the protective liner extending below the inner spacer.

2. The method of claim 1, wherein a supporting pillar is formed underneath the fin stack by recessing the substrate.

3. The method of claim 2, further comprising removing the protective liner.

4. The method of claim 3, further comprising forming a doped layer adjacent to the supporting pillar.

5. The method of claim 4, further comprising forming a bottom spacer on the doped layer and sacrificial layer.

6. The method of claim 5, wherein the bottom spacer extends above a bottom surface of the sacrificial layer.

7. The method of claim 5, further comprising forming an upper doped plug on the upper junction plate.

8. The method of claim 7, further comprising removing the sacrificial layer from the vertical fin, and forming a gate dielectric layer on the vertical fin and bottom spacer layer.

9. The method of claim 8, further comprising forming a work function layer on the gate dielectric layer.

10. The method of claim 9, further comprising forming a gauge layer on the work function layer, wherein a portion of the work function layer is exposed above the top surface of the gauge layer, and removing the exposed portion of the work function layer.

11. A method of forming a vertical field effect transistor device, comprising:
    forming one or more fin stacks on a substrate, wherein the fin stacks include a lower junction plate, a vertical fin on the top surface of the lower junction plate, and an upper junction plate on the top surface of the vertical fin;
    removing a portion of the lower junction plate and upper junction plate to form recessed spaces;
    forming an inner spacer in the recessed spaces;
    forming a sacrificial layer on the exposed surfaces of the vertical fin and the substrate;
    forming a protective liner on the sacrificial layer and inner spacers;
    removing the portion of the sacrificial layer on the surface of the substrate to leave a hanging portion of the protective liner extending below the inner spacer; and
    removing the protective liner.

12. The method of claim 11, further comprising forming a bottom spacer on the doped layer and sacrificial layer, wherein the bottom spacer extends above a bottom surface of the sacrificial layer.

13. The method of claim 12, further comprising fill layer on the bottom spacer layer, and forming an opening in the fill layer that exposes the upper junction plate.

14. The method of claim 13, further comprising forming an upper doped plug on the upper junction plate.

15. The method of claim 14, further comprising removing the fill layer and portion of the sacrificial layer on the one or more vertical fins, and forming a gate dielectric layer on the vertical fin and bottom spacer layer.

* * * * *